United States Patent [19]
Van Den Brink et al.

[11] Patent Number: 5,481,362
[45] Date of Patent: Jan. 2, 1996

[54] APPARATUS FOR PROJECTING A MASK PATTERN ON A SUBSTRATE

[75] Inventors: Marinus A. Van Den Brink; Henk F. D. Linders; Stefan Wittekoek, all of Veldhoven, Netherlands

[73] Assignee: ASM Lithography, Veldhoven, Netherlands

[21] Appl. No.: 57,437

[22] Filed: May 6, 1993

Related U.S. Application Data

[63] Continuation of Ser. No. 676,926, Mar. 28, 1991, abandoned.

[30] Foreign Application Priority Data

Jul. 16, 1990 [NL] Netherlands .................. 9001611

[51] Int. Cl.$^6$ ................................................. G01B 11/00
[52] U.S. Cl. ................................................. 356/401
[58] Field of Search ........................ 356/356, 399–401; 250/548; 355/53

[56] References Cited

U.S. PATENT DOCUMENTS

| | | | |
|---|---|---|---|
| 3,721,587 | 3/1973 | Diem . | |
| 3,811,779 | 5/1974 | Jacobs et al. ................ | 356/400 |
| 4,251,160 | 2/1981 | Bouwhuis et al. ............ | 356/401 |
| 4,356,392 | 10/1982 | Wittekoek et al. ........... | 200/201 |
| 4,698,575 | 10/1987 | Bouwer ......................... | 318/640 |
| 4,737,823 | 4/1988 | Bouwer et al. ............... | 355/53 |
| 4,771,180 | 9/1988 | Nomura et al. ............... | 250/548 |
| 4,778,275 | 10/1988 | Van Den Brink et al. ... | 356/401 |
| 4,865,455 | 9/1989 | Kohno et al. ................. | 356/400 |
| 4,871,257 | 10/1989 | Suzuki et al. ................. | 356/401 |
| 4,984,890 | 1/1991 | Tojo et al. .................... | 356/401 |
| 5,100,237 | 3/1992 | Wittekoek et al. ........... | 356/401 |

FOREIGN PATENT DOCUMENTS 0164165  12/1985  European Pat. Off. .

OTHER PUBLICATIONS

Wilczynski et al "Optical Step and Repeat Camera with Dark Field Automatic Alignment," J. Vac. Sci. Technol, vol. 16, #6, Nov./Dec. 1979, pp. 1929–1933.

Stover, "Optical Microlithography III: Technology for the Next Decade," SPIE, Dec. 1, 1984, pp. 62–69.

Ahmed et al, "Microcircuit Engineering 89," International Conference on Microlithography, Microelectronic Engineering vol. 11 1990 pp. 133–136.

*Primary Examiner*—Richard A. Rosenberger
*Assistant Examiner*—K. P. Hantis
*Attorney, Agent, or Firm*—Michael J. Balconi-Lamica; Paul R. Miller

[57] ABSTRACT

An apparatus for projecting a mask pattern (MA) on a substrate (W) by means of a projection lens system (PL) is described, which apparatus comprises a device for aligning a mask alignment mark ($M_1$, $M_2$) with respect to a substrate alignment mark ($P_1$, $P_2$). Means ($WE_1$, $WE_2$) preventing phase differences due to reflections at the mask plate (MA) from occurring within the alignment beam portions received by a detection system (13, 13') are arranged in the path of selected alignment beam portions ($b_1$, $b_1$').

28 Claims, 9 Drawing Sheets

APPARATUS FOR PROJECTING A MASK PATTERN ON A SUBSTRATE

This application is a continuation of abandoned application Ser. No. 07/676/926, filed Mar. 28, 1991, and all benefits of such earlier application are hereby claimed for this new continuation application.

The invention relates to an apparatus for projecting a mask pattern on a substrate, which apparatus successively comprises an illumination system for supplying a projection beam, a mask holder, a projection lens system and a substrate holder and which further comprises a device for aligning the mask with respect to the substrate by means of a substrate alignment mark and a mask alignment mark, said device comprising a radiation source supplying an alignment beam, the projection lens system and a radiation-sensitive detection system in the path of selected alignment beam portions which have been in interaction with a first alignment mark and a second alignment mark onto which the first alignment mark is imaged, the output signal of the detection system being a measure of the mutual position of the alignment marks.

BACKGROUND OF THE INVENTION

Aligning a mask mark and a substrate mark with respect to each other is understood to mean both directly and indirectly aligning these alignment marks. In the case of direct alignment, a mask alignment mark or a substrate alignment mark is projected onto the other mark, i.e. the substrate alignment mark or the mask alignment mark, and the radiation-sensitive detection system is arranged behind the other alignment mark. In the case of indirect alignment, both the substrate alignment mark and the mask alignment mark are projected on different parts of a further alignment mark, while the radiation-sensitive detection system is arranged behind this further alignment mark. The extent to which the substrate alignment mark and the mask alignment mark are aligned with respect to each other is determined by detecting to what extent the substrate and mask alignment marks are aligned with respect to the further alignment mark.

The selected alignment beam portions are those portions of the alignment beam which are effectively used to project the first alignment mark on the second alignment mark. If the alignment marks are diffraction gratings, the selected alignment beam portions are preferably the +1 order and −1 order sub-beams formed from the alignment beam by the first alignment mark. Alternatively, for example, also the +order and −3 order or higher order sub-beams may be used. When other alignment marks are used, the selected beam portions are of a different type. An example is the so-called dark field illumination of the first alignment mark in which the zero-order sub-beam of the radiation from this mark is suppressed and in which no separate orders can be distinguished in the beam portions located at both sides of this sub-beam.

An apparatus of the type mentioned above is described in U.S. Pat. No. 4,778,275 which relates to an apparatus for repetitive and reduced projection of a mask pattern, for example, the pattern of an integrated circuit (IC) on one and the same substrate, the mask pattern and the substrate being moved with respect to each other between two successive illuminations, for example, along two mutually perpendicular directions in a plane parallel to the substrate plane and the mask plane.

Integrated circuits are manufactured by means of diffusion and masking techniques. A number of masks with different mask patterns are consecutively projected on one and the ,same location on a semiconductor substrate. Between the consecutive projections on the same locations the substrate must undergo the desired physical and chemical changes. To this end the substrate must be removed from the apparatus after it has been illuminated with a mask pattern, and after it has undergone the desired process steps it must be placed in the apparatus again in the same position so as to illuminate it with a second mask pattern, and so forth, while it must be ensured that the projections of the second mask pattern and of the subsequent mask patterns are positioned accurately with respect to the substrate.

Diffusion and masking techniques can also be used in the manufacture of other structures having detailed dimensions of the order of micrometers, for example, structures of integrated optical systems or guiding and detection patterns of magnetic domain memories and structures of liquid crystal display panels. Also in the manufacture of these structures the projections of mask patterns must be aligned very accurately with respect to a substrate.

In view of the large number of electronic components per unit of surface area of the substrate and the resultant small dimensions of these components, increasingly stricter requirements are imposed on the accuracy with which the integrated circuits are manufactured. The position where the consecutive masks are projected on the substrate must therefore be established more and more accurately.

In order to be able to realise the desired, very precise positioning accuracy, within several tenths of one micrometer in the apparatus according to U.S. Pat. No. 4,778,275, of the projection of the mask pattern with respect to the substrate, this apparatus comprises a device for aligning the substrate with respect to the mask pattern with which an alignment mark provided in the substrate is imaged on an alignment mark provided in the mask. If the image of the substrate alignment mark accurately coincides with the mask alignment mark, the substrate is correctly aligned with respect to the mask pattern. The main element for imaging the substrate mark on the mask mark is constituted by the projection lens system, or imaging system with which the mask pattern is imaged on the substrate.

It has been found that the alignment device according to U.S. Pat. No. 4,778,275 principally operates in a satisfactory manner, but that hitherto inexplicable alignment errors occur under certain circumstances.

SUMMARY OF THE INVENTION

The present invention relates to the discovery of the cause of these alignment errors and has for its object to provide an apparatus in which these errors are eliminated.

The apparatus according to the invention is characterized in that means preventing phase differences due to reflections at a mask plate from occurring within the selected alignment beam portions received by the detection system are arranged in the radiation path of the selected alignment beam portions.

The invention is based on the discovery that if, for example in the case that a substrate alignment mark is projected on a mask alignment mark, and the alignment marks are diffraction gratings while +1 order and −1 order alignment beam portions formed by the substrate alignment mark are used for the projection, the axis of symmetry of these alignment beam portions is not perpendicular to the mask plate extra phase differences and hence extra intensity variations, which are independent of the alignment, may be produced in the radiation which is received by the detection system, with the result that the alignment error signal obtained is no longer correct. These extra intensity variations are produced because portions of the double order sub-beams, hence sub-beams which are diffracted both by the substrate alignment mark and by the mask alignment mark, are once more reflected by a mask plate surface towards the mask alignment mark and are subsequently reflected by this mark and diffracted in the direction of the double order sub-beams. These portions, which may be designated as three-fold order sub-beams, traverse different path lengths in the mask plate and exhibit a mutual phase difference at the location of the detection system so that they influence the output signal of this detection system.

Also in alignment devices in which the beam portions reflected in the mask plate are not again incident on the mask alignment mark, or in which marks other than diffraction gratings are used as alignment marks, the above-mentioned phase difference and hence an erroneous alignment signal may be produced.

Since the above-mentioned phase difference is dependent on the thickness of the mask plate, the alignment of a first mask plate with respect to a substrate will differ from the alignment of a second mask plate with respect to the same substrate when using mask plates of different thicknesses in one and the same apparatus.

The extent to which the phase difference leads to an alignment error is dependent on the reflection coefficient of the mask plate, so that the use, in one and the same apparatus, of mask plates having different reflection coefficients in turn leads to a difference between the alignment of a first mask plate and that of a second mask plate with respect to the same substrate.

Finally the phase difference is dependent on the angle between the normal on the mask plate and the axis of symmetry of the alignment beam portions, which angle may differ from apparatus to apparatus. When several apparatuses are used for consecutive process steps of one and the same substrate, the alignment of the substrate with respect to a mask may differ, even if the mask plates used have the same thickness and reflection coefficient. The differences in the extent of alignment could then be corrected in the apparatuses themselves. However, such a correction is principally impossible if the mask plates used have different thicknesses and/or reflection coefficients.

The axis of symmetry of the alignment beam portions is an imaginary axis and not a physical axis. If the sub-beams of the alignment beam diffracted in the +1 order and the −1 order by the first alignment mark are directed onto the second alignment mark, this axis is located symmetrically with respect to the principal axes of the two first-order sub:beams and coincides, for example, with the principal ray of the fictitious zero-order sub-beam which does not take part in the projection.

After the effect of the phase difference due to the internal reflections has been discovered, it can be prevented with fairly simple means as proposed in the present invention.

A first possibility is realised in an apparatus which is characterized in that a part of the mask plate surface located opposite the mask alignment mark is anti-reflective to the alignment radiation.

This prevents portions of the double order sub-beams from being reflected to the second alignment mark so that three-fold order sub-beams cannot be produced.

The invention is also embodied in a novel mask plate which is intended for use in an alignment device and which has a mask alignment mark. This mask plate is characterized in that at least a part of the plate surface located opposite the mask alignment mark is anti-reflective to the alignment radiation.

However, use is preferably made of a second possibility of preventing the extra phase differences, for which no special mask plate is necessary. An apparatus in which this possibility is realised is characterized in that a radiation deflection element is arranged in the vicinity of a mask alignment mark for directing the axis of symmetry of selected alignment beam portions principally perpendicularly to the plane of the mask plate, the radiation deflection element being considerably smaller than the cross-section of the projection beam in the plane of the plate.

It is true that portions of the double order sub-beams may once more be reflected towards the second alignment mark so that three-fold order sub-beams deflected in opposite directions are produced. However, the deflection element ensures that the last-mentioned sub-beams traverse the same path lengths in the plate of the second alignment mark so that no extra phase differences occur between these sub-beams.

The perpendicular directing of the axis of symmetry is understood to mean that the beam portions themselves, for example, the beam portions diffracted in the +1 order and the −1 order by the first alignment mark are directed in such a way that the axis of symmetry of these portions, corresponding to the chief ray of the fictitious zero-order sub-beam, is perpendicular to the second alignment mark.

The deflection element is arranged as close as possible to the mask alignment mark so that the narrow beam portions overlap each other satisfactorily at the mark and consequently the surface of this element may be small. This element will not affect the projection beam. Moreover, the deflection element is only to realise a relatively small direction correction so that it only needs to have a small thickness. Consequently, it is not necessary to impose strict requirements on the mechanical and thermal stability of this element.

In accordance with a further characteristic feature, the deflection element is constituted by a wedge-shaped body of a material which is transparent to the alignment beam.

Other deflection elements such as, for example, a mirror may be used instead of a wedge-shaped element. However, the requirements of stability to be imposed on such a mirror must be stricter than those imposed on the stability of a wedge-shaped element.

As described in U.S. Pat. No. 4,778,275 an apparatus for imaging a mask pattern on a substrate preferably comprises, in addition to the device for aligning a first mask alignment mark with respect to a substrate alignment mark, a second analog device for aligning a second mask alignment mark with respect to a substrate alignment mark by means of a second alignment beam. The relative angle orientation of the mask pattern and the substrate can then be established directly and optically and the magnification with which the projection lens system images the mask pattern on the substrate can be determined. Such an apparatus in which the invention is used is characterized in that a second radiation deflection element is arranged in the path of the second alignment beam and in the vicinity of a second mask alignment mark.

Due to the growing demand for more electronic components per unit of surface area of the substrate, hence for smaller dimensions of these components, there is a greater need for an apparatus which can make images whose line widths are considerably smaller than 1 μm, for example, of the order of 0.2 to 0.3 micrometers. Use is then preferably made of a projection beam whose wavelength is in the far ultraviolet range. Such a projection beam can be supplied by an excimer laser, for example, a krypton-fluoride laser having a wavelength of 248 nm, an argon-fluoride laser having a wavelength of 193 nm, or an Nd-YAG laser whose frequency is quadrupled and which has a wavelength of 256 nm.

As has been noted in U.S. Pat. No. 4,778,275 a helium-neon laser beam with a wavelength of 633 nm is preferably used as an alignment beam, because such a beam cannot cause any change in the photoresist provided on the substrate and because it is not weakened by this photoresist. The projection lens system is optimally corrected for the projection beam wavelength and may form a sharp image of the mask pattern on the substrate. However, due to the different wavelength of the alignment beam the substrate mark and the mask mark cannot be sharply imaged on each other by this beam and the projection lens system. The sharp image of a substrate alignment mark formed by the projection lens system is located at some distance from the associated mask alignment mark. The result is that the alignment signal, which is derived from the signals of the radiation-sensitive detection system, is no longer determined by alignment errors only but is also influenced by, for example, tilting of the substrate or by instabilities of the alignment beam. When displacing a substrate alignment mark with respect to a mask alignment mark in such a way that the alignment signal has the desired value, an alignment error may then subsist.

In order to achieve that a substrate alignment mark is nevertheless sharply imaged on a mask alignment mark inspite of the non-optimum wavelength of the alignment beam for the projection lens system, the apparatus is preferably further characterized in that a refractive correction element is arranged in the path of an alignment beam and in the projection lens system, which element is considerably smaller than the cross-section of the projection lens system in the plane of the element and which only directs and focuses the selected alignment beam portions from the first alignment mark on the second alignment mark.

The refractive correction element is arranged at such a height in the projection lens system that the sub-beams of the different diffraction orders of an alignment beam, which sub-beams are formed by a first alignment mark, are sufficiently separated in the plane of the correction element so that these sub-beams can be separately influenced, and that this correction element has a negligible influence on the projection beam and the mask image formed thereby. Under circumstances the correction element may be opaque to the projection beam. This prevents this element from .causing phase differences in the projection beam.

A preferred embodiment of the apparatus is characterized in that the correction element is arranged in the Fourier plane of the projection lens system.

The projection lens is a composite lens system having a large number of lens elements which may be considered to be arranged in a first group of lenses and in a second group of lenses. The Fourier plane is present between these two groups of lenses. The first lens group forms a so-called Fourier transform of an object, in this case an alignment mark, while the second lens group retransforms this Fourier transform into an image of the object. The various diffraction orders of the alignment beam which are formed by the object are focused and separated from one another in the Fourier plane.

Since the correction element is a refractive element, which influences the direction of the rays passing therethrough and thus directly displaces the position of the point at which these rays are combined, this correction element in itself is already very effective. Moreover, since the refractive correction element is arranged at a relatively large distance from the second alignment mark, its effectiveness is considerably increased. The optical power of this element can therefore remain limited so that it is relatively insensitive to mechanical and thermal instabilities.

An additional advantage of the refractive correction element is that this element operates as a spatial filter for the selected diffraction orders because it deflects only the portions of the alignment beam to the second alignment mark that are diffracted in the selected diffraction orders. As a result, known advantages are obtained without having to arrange a separate order filter in the radiation path, as in known devices. The advantages are: the contrast with which the first alignment mark is imaged on the second alignment mark is increased, possible irregularities in the first alignment mark do not have any influence on the alignment signal obtained and the accuracy with which the two marks are aligned with respect To each other is twice as large as in the case of using also the zero-order sub-beam of the alignment beam for the imaging.

The refractive correction element may have various shapes and may consist of, for example, a double optical wedge.

A preferred embodiment of the apparatus is characterized in that the refractive correction element is a lens.

With such a correction lens it is not only possible to correct the position of the focus point but also the magnification with which a substrate alignment mark is imaged can be corrected for the greater part.

There are various embodiments of the apparatus according to the invention, which embodiments are distinguished from one another in the way in which the substrate alignment mark and the mask alignment mark are imaged on each other and possibly on a reference alignment mark.

A first embodiment is characterized in that the first alignment mark is a substrate alignment mark and the second alignment mark is a mask alignment mark, and in that the radiation deflection dement is arranged in the path of the alignment radiation coming from the substrate alignment mark.

A second embodiment is characterized in that the first alignment mark is a mask alignment mark and the second alignment mark is a substrate alignment mark, and in that the radiation deflection element is arranged in the path of the alignment radiation coming from the mask alignment mark.

A third embodiment is characterized in that the second alignment mark is a reference alignment mark which is located outside the substrate and outside the mask, and in that both a substrate alignment mark and a mask alignment mark constitute first alignment marks which are each imaged on the reference alignment mark.

A fourth embodiment is characterized in that the radiation source of the alignment device supplies two radiation beams which form an interference pattern in the plane of a substrate alignment mark and in the plane of a mask alignment mark, in that the first alignment mark is constituted by the interference pattern and in that both the substrate alignment mark and the mask alignment mark are second alignment marks.

A preferred embodiment of the apparatus is further characterized in that a substrate alignment mark is constituted by a phase diffraction grating and a mask alignment mark is constituted by an amplitude diffraction grating.

As described in U.S. Pat. No. 4,251,160, periodical gratings as compared with other alignment marks such as, for example, square marks or perpendicularly intersecting strips have the advantage that when measuring position errors, averaging over the gratings occurs. As a result it is possible to align accurately, even if the gratings have irregularities such as deviations from the nominal width of the grating strips and/or, in the case of profile gratings, deviations from the nominal profile of the grating grooves. The substrate gratings are only to be provided once for the entire manufacturing cycle of an integrated circuit and need not be provided in each newly provided layer. As compared with amplitude gratings, phase gratings on the substrate have the advantage that they remain very "visible". Moreover, the phase gratings are very resistant to the large number of diffusion processes to which the substrate must be subjected during the manufacture of integrated circuits.

By combining grating-shaped alignment marks and filtering the selected order sub-beams, it is achieved that the alignment signal is not influenced by higher order deviations of the grating shapes.

The preferred embodiment of the apparatus according to the invention may be further characterized in that means controlled by periodical signals are arranged in the radiation path of an alignment beam for periodically displacing with respect to each other a second alignment mark and the image on this mark of a first alignment mark observed by the detection system. In the case of grating marks the displacement is of the order of half a period of the second alignment mark.

The means may be constituted by a drive member for the second alignment mark so that this alignment mark is periodically moved, or by a polarization modulator in combination with polarization-sensitive elements which ensure that the image of the first alignment mark is effectively oscillated across a second alignment mark. By periodically displacing the image of the first mark observed by the detection system with respect to the second mark, a dynamic alignment signal is obtained and the accuracy and sensitivity of the apparatus are considerably improved. The latter is important if the substrate alignment marks only reflect weakly.

BRIEF DESCRIPTION OF THE DRAWINGS

Embodiments of the invention will now be described in greater detail with reference to the accompanying drawings in which.

DESCRIPTION OF THE INVENTION

Figure 1:
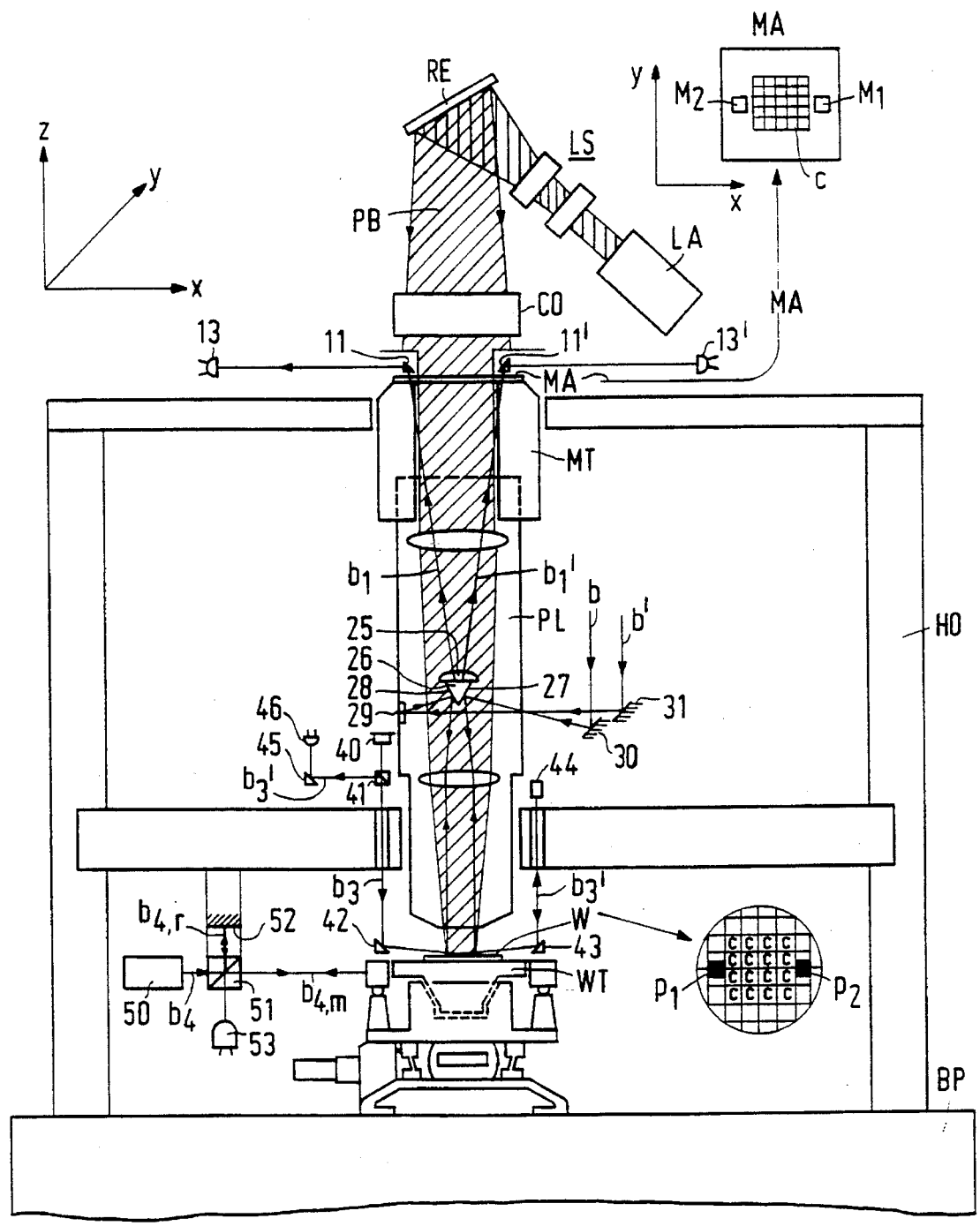
FIG. 1 shows an embodiment of an apparatus for repetitive imaging of a mask pattern on a substrate.

FIG. 1 shows an embodiment of an apparatus for repetitive imaging of a mask pattern on a substrate. The main components of this apparatus are a projection column, in which a mask pattern C to be imaged is arranged and a movable substrate table WT with which the substrate can be positioned with respect to the mask pattern C.

The projection column incorporates an illumination system which comprises, for example, a laser LA, for example a krypton-fluoride laser, a lens system LS, a mirror RE and a condensor lens CO. The projection beam PB illuminates the mask pattern C present in the mask MA which is arranged on a mask table MT.

The beam PB passing through the mask pattern C traverses a projection lens system PL arranged in the projection column and shown only diagrammatically, which system forms an image of the pattern C on the substrate W. The projection lens system has, for example a magnification $M=⅕$, a numerical aperture $N.A.=0.48$ and a diffraction-limited image field with a diameter of 21.2 mm.

The substrate W is arranged on a substrate table WT supported in, for example, air bearings. The projection lens system PL and the substrate table WT are arranged in a housing HO which is closed at its lower side by a base plate BP of, for example granite and at its upper side by the mask table MT.

As is shown in the top right-hand corner in FIG. 1, the mask MA has two alignment marks $M_1$ and $M_2$. These marks preferably consist of diffraction gratings, but they may be alternatively formed by other marks such as squares or strips which are optically distinguished from their surroundings. The alignment marks are preferably two-dimensional, i.e. they extend in two mutually perpendicular directions, the X and Y directions in FIG. 1. The substrate W, for example, a semiconductor substrate on which the pattern C must be projected side by side for a number of times, comprises a plurality of alignment marks, preferably also two-dimensional diffraction gratings, two of which, $P_1$ and $P_2$ are shown in FIG. 1. The marks $P_1$ and $P_2$ are located outside the regions on the substrate W where the projections of the pattern C must be formed. Preferably, the grating marks $P_1$ and $P_2$ are in the form of phase gratings and the grating marks $M_1$ and $M_2$ are in the form of amplitude gratings.

Figure 2:
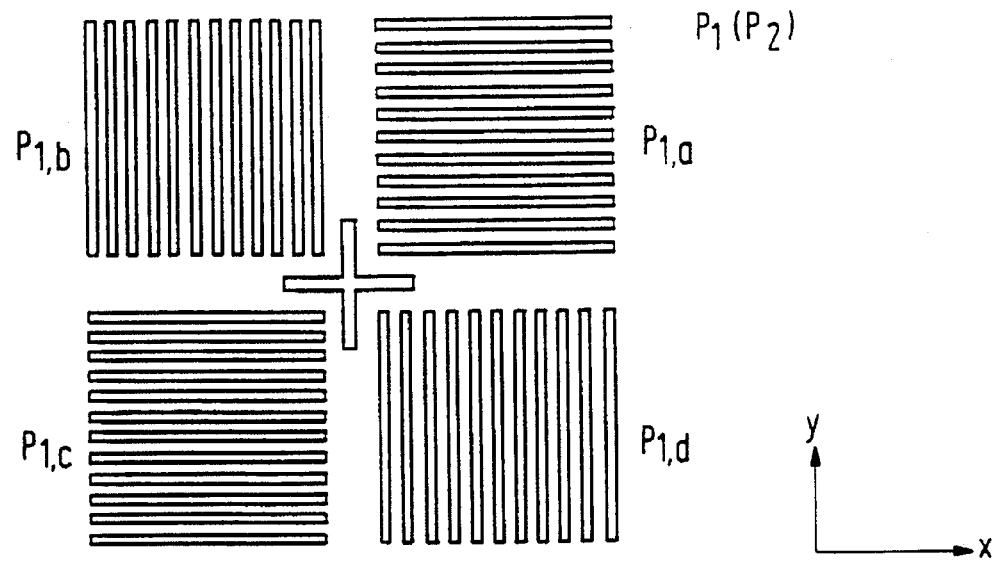
FIG. 2 shows a known embodiment of an alignment mark in the form of a two-dimensional grating.

FIG. 2 shows an embodiment of one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for alignment in the X direction and the two other sub-gratings, $P_{1,a}$ and $P_{1,c}$, are used for alignment in the Y direction. The two sub-gratings $P_{1,b}$ and $P_{1,c}$ have a grating period of, for example, 16 μm and the sub-gratings $P_{1,a}$ and $P_{1,d}$ have a grating period of, for example, 17.6 μm. Each sub-grating may have a dimension of, for example, 200×200 μm. An alignment accuracy which in principle is less than 0.1 μm can be achieved with these gratings and a suitable optical system. The different grating periods have been chosen so as to increase the capture range of the alignment device.

FIG. 1 shows a first embodiment of an alignment device, namely a double alignment device in which two alignment beams b and b' are used for aligning the substrate alignment mark $P_2$ on the mask alignment mark $M_2$, and the substrate alignment mark $P_1$ on the mask alignment mark $M_1$. The beam b is reflected to the reflective surface 27 of a prism 26 by means of a reflecting element 30, for example, a mirror. The surface 27 reflects the beam b to the substrate alignment mark $P_2$ which sends a part of the radiation as beam $b_1$ to the associated mask alignment mark $M_2$ where an image of the mark $P_2$ is formed. A reflecting element 11, for example a prism which directs the radiation passed by the mark $M_2$ to a radiation-sensitive detector 13 is arranged above the mark $M_2$.

The second alignment beam b' is reflected to a reflector 29 in the projection lens system PL by a mirror 31. This reflector 29 sends the beam b' to a second reflecting surface 28 of the prism 26, which surface directs the beam b' on the substrate alignment mark $P_1$. This mark reflects a part of the radiation of the beam b' as beam $b_1'$ to the mask alignment mark $M_1$ where an image of the mark $P_1$ is formed. The radiation of the beam $b_1'$ passing through the mark $M_1$ is directed towards a radiation-sensitive detector 13' by a reflector 11'.

Figure 3:
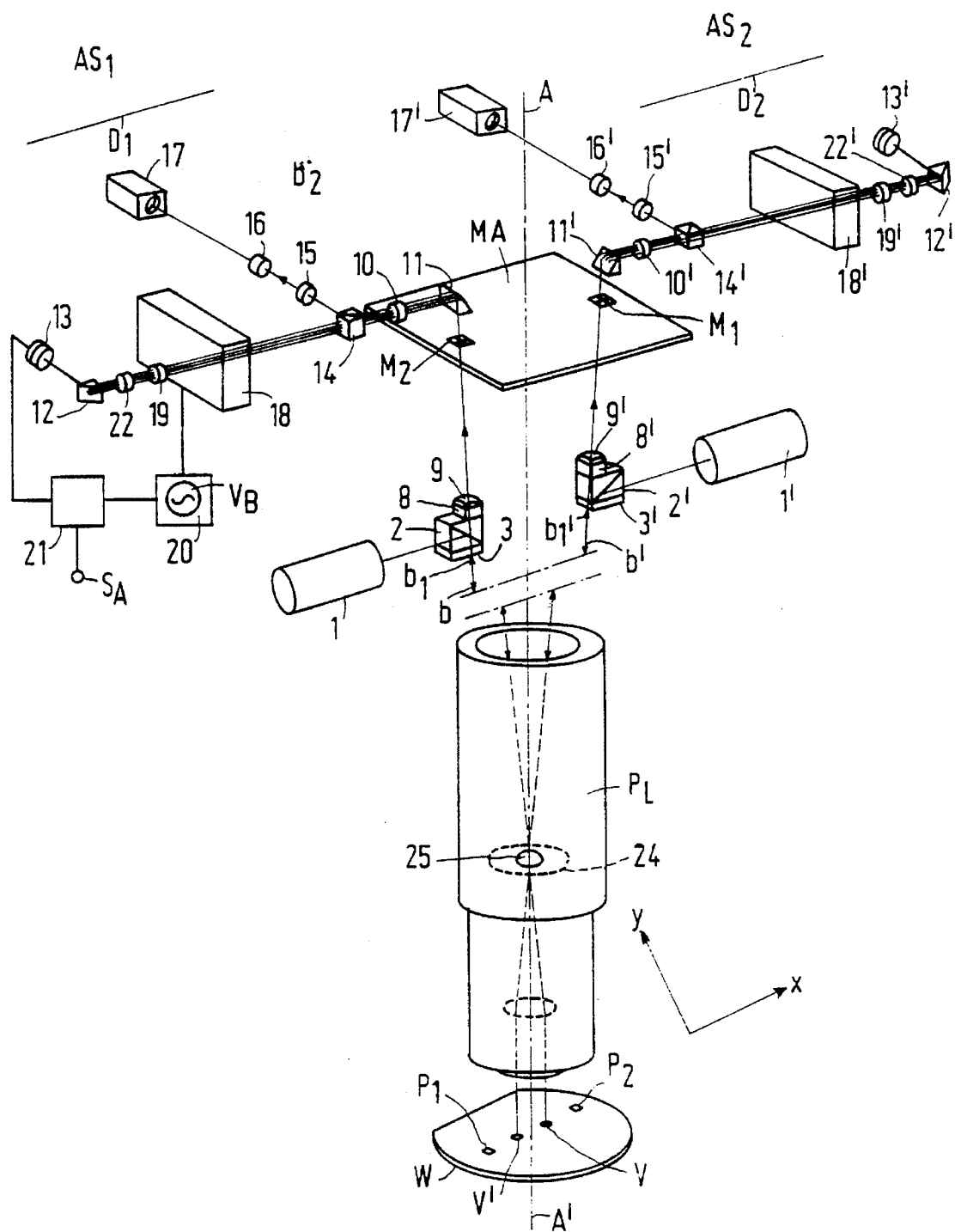
FIG. 3 shows a first embodiment of an apparatus according to the invention comprising two alignment devices.

The operation of the double alignment device will be further described with reference to FIG. 3 showing a further embodiment of such a device.

The projection apparatus further comprises a focus error detection system for determining a deviation between the focal plane of the projection lens system PL and the surface of the substrate W so that this deviation can be corrected, for example, by moving the projection lens system along its axis. This system may be constituted by the elements 40, 41, 42, 43, 44, 45 and 46 which are arranged in a holder (not shown) which is fixedly connected to the projection lens system. The reference numeral 40 denotes a radiation source, for example a diode laser which emits a focusing beam $b_3$. This beam is directed onto the substrate at a very small angle by a reflecting prism 42. The beam reflected by the substrate is directed towards a retroreflector 44 by the prism 43. The element 44 reflects the beam in itself so that this beam ($b_3'$) once more traverses the same path through reflections on the prism 43, the substrate W and the prism 42. The beam $b_3'$ reaches a radiation-sensitive detection system 46 via a partly reflecting element 41 a reflecting element 45. This detection system comprises, for example, a position-dependent detector or two separate detectors. The position of the radiation spot formed by the beam $b_3'$ on this system is dependent on the extent to which the focal plane of the projection lens system coincides with the plane of the substrate W. For an extensive description of the focus error detection system reference is made to U.S. Pat. No. 4,356,392.

In order to determine the X and Y positions of the substrate table WT very accurately, the projection apparatus comprises a multiple axis interferometer system, of which only a single axis sub-system is diagrammatically shown in FIG. 1 by means of a radiation source 50 in the form of a laser, a beam splitter 51, a fixedly arranged reflecting element 52 and a detection system 53. The beam $b_4$ emitted by the source 50 is split by the beam splitter into a measuring beam $b_{4,m}$ and a reference beam $b_{4,r}$. The measuring beam reaches a reflecting side face of the substrate table and the beam splitter 51 combines the reflected measuring beam with the reference beam reflected by the reflecting element 52 so as to form an interference pattern at the location of the detection system 53. The composite interferometer system may be implemented as described in U.S. Pat. No. 4,251,160 and then it operates with two beams. Instead of this so-called two-axis interferometer system, a three-axis system as described in U.S. Pat. No. 4,737,823 can be used.

By using the substrate table position detection device in the form of an interferometer system during alignment the positions of, and the mutual distances between the alignment marks $P_1$ and $P_2$ and $M_1$ and $M_2$ can be related to a system of coordinates defined by the interferometer system. It is then not necessary to refer to a frame of the projection apparatus or to a component of this frame, so that variations in this frame due to, for example, temperature variations, mechanical creep and the like do not have any influence on the measurements.

FIG. 3 shows the principle of the double alignment device with reference to an embodiment which is distinguished from that in FIG. 1 by the different manner of coupling the alignment beams b and b' into the projection lens system. The apparatus comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the system $AS_2$ being distinguished from those of the system $AS_1$ by their primed notation.

The structure of the system $AS_1$ as well as the way in which the mutual position of the mask mark $M_2$ and, for example, the substrate mark $P_2$ is determined will now be described.

The alignment system $AS_1$ comprises a radiation source 1, for example, a helium-neon laser which emits an alignment beam b. This beam is reflected towards the substrate W by a beam splitter 2. The beam splitter may be a partially transparent mirror or a partially transparent prism, but it is preferably a polarization-sensitive splitting prism which is succeeded by a $\lambda/4$ plate 3 in which $\lambda$ is the wavelength of the beam b. The projection lens system PL focuses the beam b to a small radiation spot V having a diameter of the order of 1 mm on the substrate W. This substrate reflects a part of the beam as beam $b_1$ in the direction of the mask M. The beam $b_1$ traverses the projection lens system PL, which system images the radiation spot V on the mask. Before the substrate is arranged in the illumination apparatus, it has been prealigned in a prealigning station coupled to the apparatus, for example, the station described in European Patent Application no. 0,164,165, so that the radiation spot V is located on the substrate mark $P_2$. This mark is then imaged by the beam $b_1$ on the mask mark $M_2$. Taking the magnification M of the projection lens system into account, the dimension of the mask mark $M_2$ is adapted to that of the substrate mark $P_2$ so that the image of the mark $P_2$ accurately coincides with the mark $M_2$ if the two marks are mutually positioned in the correct manner.

On its path to and from the substrate W the beam b and $b_1$ has traversed twice the $\lambda/4$ plate 3 whose optical axis extends at an angle of 45° to the direction of polarization of the linearly polarized beam b coming from the source 1. The beam $b_1$ passing through the $\lambda/4$ plate then has a direction of polarization which is rotated 90° with respect to the beam b, so that the beam $b_1$ is passed by the polarization splitting prism 2. The use of the polarization splitting prism in combination with the λ/4 plate provides the advantage of a minimum radiation loss when coupling the alignment beam into the radiation path of the alignment system.

The beam $b_1$ passed by the alignment mark $M_2$ is reflected by a prism 11 and directed, for example, by a further reflecting prism 12 towards a radiation-sensitive detector 13. This detector is, for example, a composite photodiode having, for example, four separate radiation-sensitive areas in conformity with the number of sub-gratings according to FIG. 2. The output signals of these detectors are a measure of the coincidence of the mark $M_2$ with the image of the substrate mark $P_2$. These signals may be processed electronically and used for moving the mask with respect to the substrate by means of driving systems (not shown) so that the image of the mark $P_2$ coincides with the mark $M_2$. Thus, an automatic alignment device is obtained.

A beam splitter 14 in the form of, for example, a partially transparent prism may be arranged between the prism 11 and the detector 13, which beam splitter splits a pan of the beam $b_1$ as beam $b_2$. The split beam $b_2$ is then incident via, for example, two lenses 15 and 16 on a television camera 17 which is coupled to a monitor (not shown) on which the alignment marks $P_2$ and $M_2$ are visible to an operator of the illumination apparatus. This operator can then ascertain whether the two marks coincide and, if necessary, he may move the substrate W by means of manipulators so as to cause the marks to coincide.

Analogously as described hereinbefore for the marks $M_2$ and $P_2$, the marks $M_1$ and $P_2$ and the marks $M_1$ and $P_1$, respectively, can be aligned with respect to each other. The alignment system $AS_2$ is used for the two last-mentioned alignments.

For details about the alignment procedure by means of the alignment systems reference is made to U.S. Pat. No. 4,778,275.

The alignment marks $P_1$ and $P_2$ in the form of gratings, or other diffraction elements split the alignment beams incident thereon into a non-deflected zero-order sub-beam and a plurality of (deflected) first-order and higher order sub-beams. Of these sub-beams only those having the same order number, preferably the first-order sub-beams, are selected in the alignment device so as to image a substrate alignment mark on a mask alignment mark. The sub-beams incident on a mask alignment mark are split into different diffraction orders by this mark so that a plurality of sub-beams of double diffraction orders is produced which are directed towards the associated radiation-sensitive detection system 13 or 13' and interfere with each other. An interference pattern which moves when alignment errors of the mask with respect to the substrate occur is then produced at the location of this detection system.

As is shown in FIGS. 1 and 3, the chief rays of the beams $b_1$ and $b_1'$, which chief rays can be considered to be the axes of symmetry of the sub-beams formed by the substrate alignment marks $P_2$ and $P_1$, traverse the mask plate MA obliquely. A part of this mask plate at the location of the alignment mark $M_1$ in the form of a grating is shown on a larger scale in FIG. 4. This Figure also shows the chief rays $b_1'(+1)$ and $b_1'(-1)$ which are formed by the substrate alignment mark (not shown). The reference SA denotes the axis of symmetry of the sub-beams $b_1'(+1)$ and $b_1'(-1)$, and the direction of this axis coincides, for example, with that of the zero-order sub-beam $b_1'(0)$ which is blocked and does not reach the mark $M_1$. The sub-beams $b_1'(+1,0)$ and $b_1'(+1,-1)$ formed by the grating mark $M_1$ from the sub-beam $b_1'(+1)$ and the sub-beams $b_1'(-1,0)$ and $b_1'(-1,+1)$ formed from the sub-beam $b_1'(-1)$ are captured by the detection system 131 (not shown). The sub-beams having different double diffraction orders may be either blocked or diffracted at such angles that they do not reach the detection system.

Figure 4:
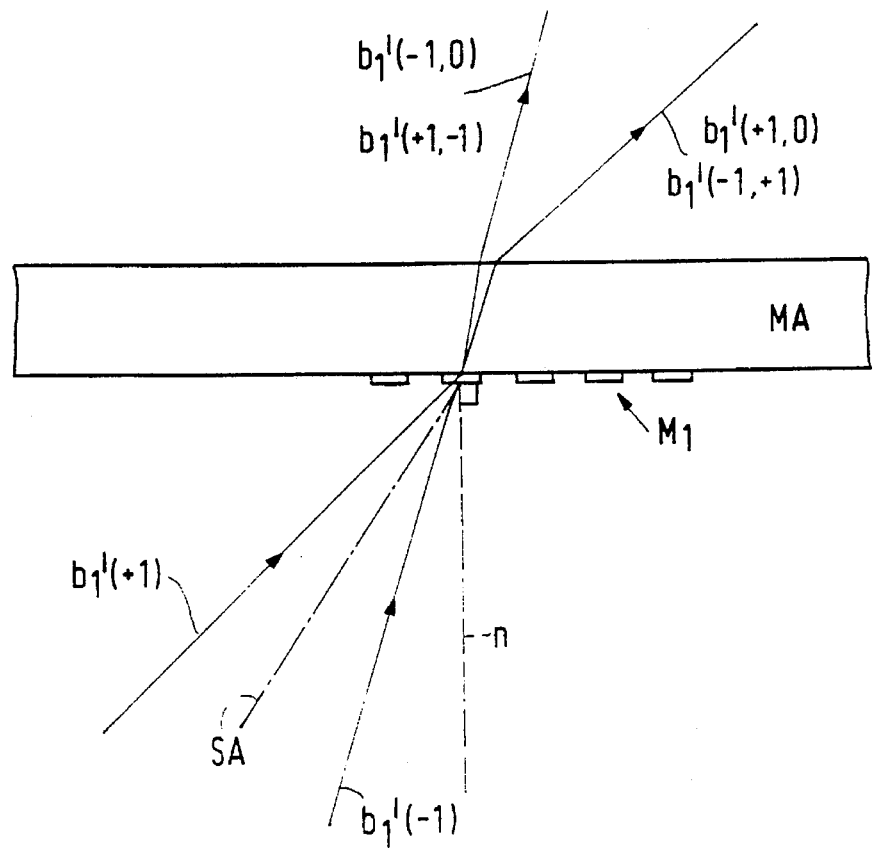
FIG. 4 shows the path of the alignment radiation through the mask plate.
Figure 5:
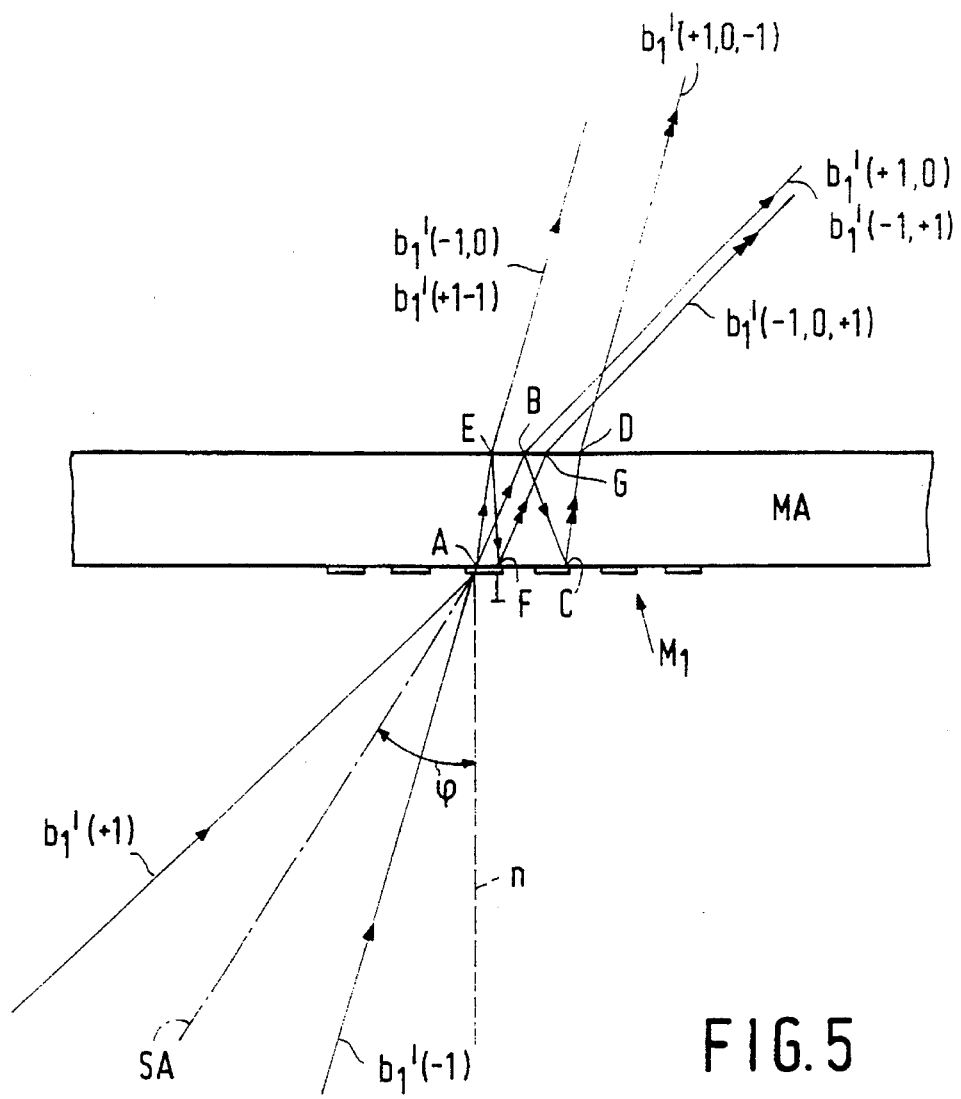
FIG. 5 shows this path when reflections occur on this plate.

As long as only the sub-beams $b'(-1,0)$, $b_1'(+1,-1)$, $b_1'(+1,0)$ and $b_1'(-1,+1)$ shown in FIG. 4 interfere with each other at the location of the detection system, the oblique position of the symmetry axis does not result in an alignment error. However, as the Applicant has discovered and as is shown in FIG. 5, a portion of the double order sub-beam $b_1'(+1,0)$ may be reflected by the upper side of the mask plate MA so that it is once more incident on the grating mark $M_1$. The three-fold order sub-beam $b_1'(+1,0,-1)$ is then formed by this grating, which sub-beam has the same direction as the double order sub-beams $b_1'(-1,0)$ and $b_1'(+1,-1)$. A portion of the double order sub-beam $b_1'(-1,0)$ may also be reflected by the upper side of the mask plate so that it is once more incident on the grating mark $M_1$. This produces a three-fold order sub-beam $b_1'(-1,0,+1)$ which has the same direction as the double order sub-beams $b_1'(+1,0)$ and $b_1'(-1,+1)$.

Although the mark $M_1$ may also supply 3rd-order, 5th-order and higher order beams and also higher order reflections may occur in the mask plate, it is sufficient and better for the purpose of comprehension to use the two-fold and three-fold first-order diffracted sub-beams only.

The sub-beam $b_1'(+1,0,-1)$ has covered the path ABCD in the mask plate MA and the sub-beam $b_1'(-1,0,+1)$ has covered the path AEFG which is shorter than the path ABCD. Consequently, there is a phase difference among the three-fold order sub-beams $b_1'(+1,0,-1)$ and $b_1'(-1,0,+1)$ and between these sub-beams and the corresponding double order sub-beams. As a result of this phase difference, which is mainly dependent on the thickness of the mask plate and the angle $\phi$ between the axis of symmetry SA and the normal n on the mask plate, the interference pattern is displaced with respect to the detection system, which displacement is independent of alignment errors. As a result of this displacement, a so-called offset occurs in the alignment signal and in the realised alignment of the mask with respect to the substrate, and the magnitude of this offset is dependent on the reflection coefficient and the thickness of the mask plate. For one projection apparatus in which different masks are used this offset may be different for the different masks, while for one mask which is consecutively used in different projection apparatuses the offset in the different apparatuses may be different because the angle $\phi$ may be different.

The offset is relatively large when using coherent alignment radiation as is supplied by a gas laser, but may also occur, though to a lesser extent when using less coherent or non-coherent alignment radiation as supplied by excimer lasers, semiconductor lasers or mercury lamps.

In addition to the discovery of the cause of the alignment errors, the present invention also provides two possibilities of eliminating these errors. The first possibility, which may generally be used, i.e. independently of the number of diffraction orders of the alignment beam, and which is the simplest possibility for the projection apparatus is to provide the upper side of the mask plate with an anti-reflection coating. Then, three-fold diffraction orders cannot be produced, which results in the situation illustrated in FIG. 4.

Figure 6:
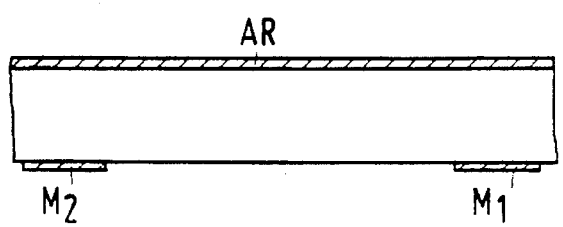
FIG. 6 shows a first embodiment of a mask plate according to the invention.

FIG. 6 shows a novel mask plate MA having such a layer AR. This layer may be composed in such a way that the projection beam is not influenced thereby. Then the layer can cover the entire surface of the mask plate.

Figure 7:
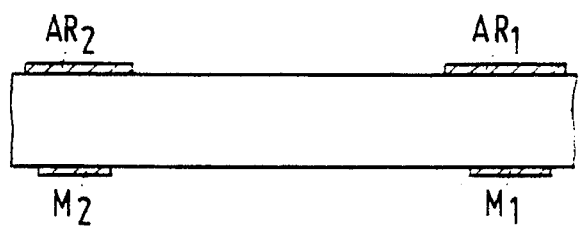
FIG. 7 shows a second embodiment of this plate.

However, as is shown in FIG. 7, it is alternatively possible to apply anti-reflection coatings $AR_1$ and $AR_2$ only at the location of the mask alignment marks $M_1$ and $M_2$. Since the projection beam PB does not traverse the marks $M_1$ and $M_2$ and neither the layers $AR_1$ and $AR_2$, as is illustrated in FIG. 1, the projection beam need not be taken into account when composing this layer.

A second possibility of eliminating the alignment error, which possibility does not require any adaptation of the mask plate and can be used if the alignment radiation incident on the mask mark has an axis of symmetry which is the case, for example, if only two diffraction orders are incident on this mask, is to arrange a beam deflection element between the projection lens system PL and the mask plate MA, which element ensures that the axis of symmetry of the sub-beams used is perpendicular to the mask plate, i.e. the chief rays of these having equal but opposite diffraction orders sub-beams are incident on the mask plate at equal but opposite angles.

Figure 8:
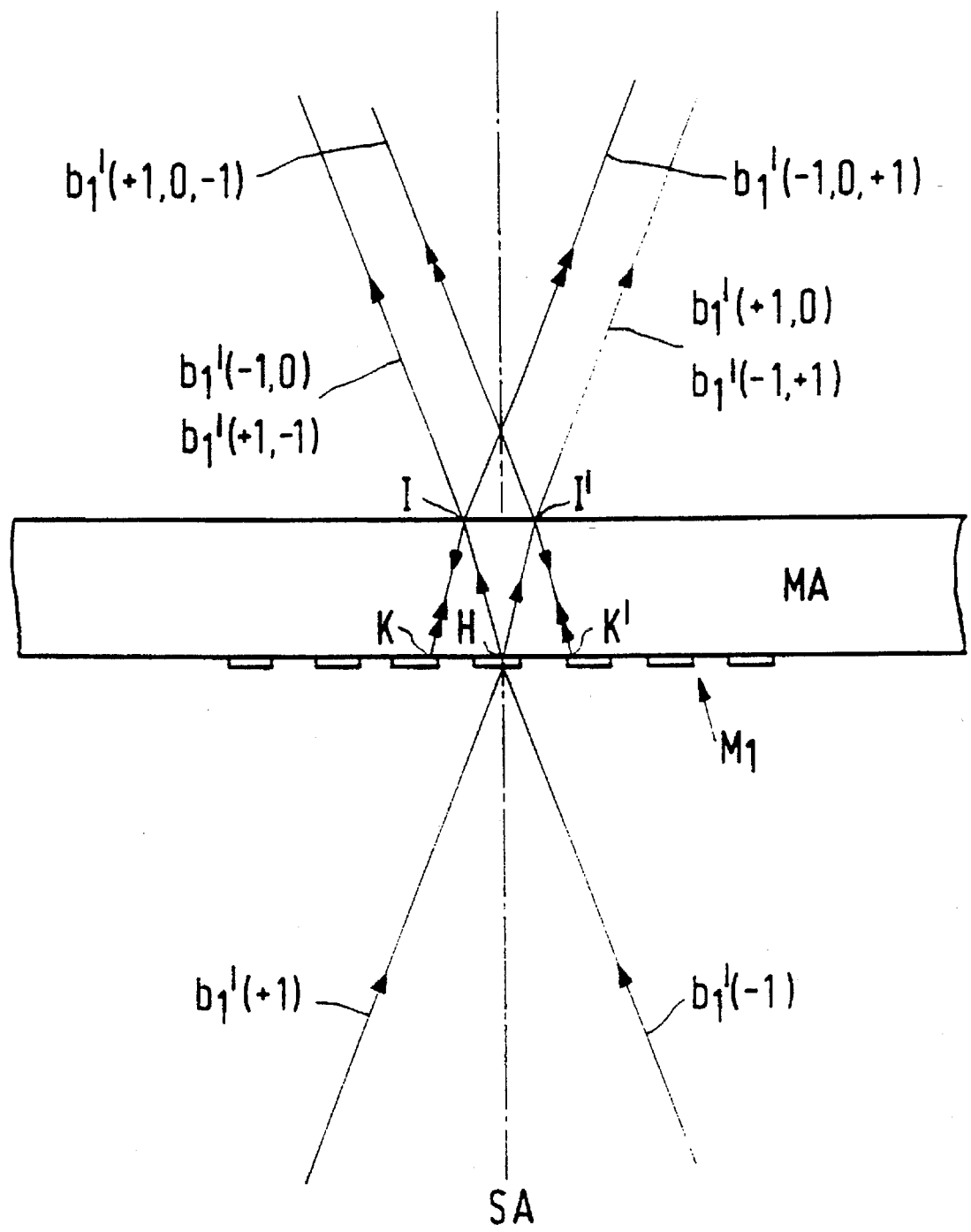
FIG. 8 shows the path of the alignment radiation through the mask plate in a device according to the invention.

FIG. 8 shows the situation in which the first-order sub-beams $b_1'(-1)$ and $b_1'(+1)$, which originate from the substrate alignment mark $P_1$, are symmetrically incident on the mask alignment mark $M_1$. The portion of the sub-beams $b_1'(-1,0)$ which is reflected by the upper side of the mask plate and is reflected as a three-fold order sub-beam $b_1'(-1,0,+1)$ by the grating $M_1$ traverses the path HIK through the mask plate, which path is equally long as the path HI'K' traversed by the three-fold order sub-beam $b_1'(+1,0,-1)$, which sub-beam is formed from the part of the sub-beam $b_1'(+1,0)$ reflected by the upper side of the mask plate. Then there is no longer any phase difference between the three-fold order sub-beams and the corresponding two-fold order sub-beams, whereby the cause of the alignment error described hereinbefore is eliminated.

Figure 9:
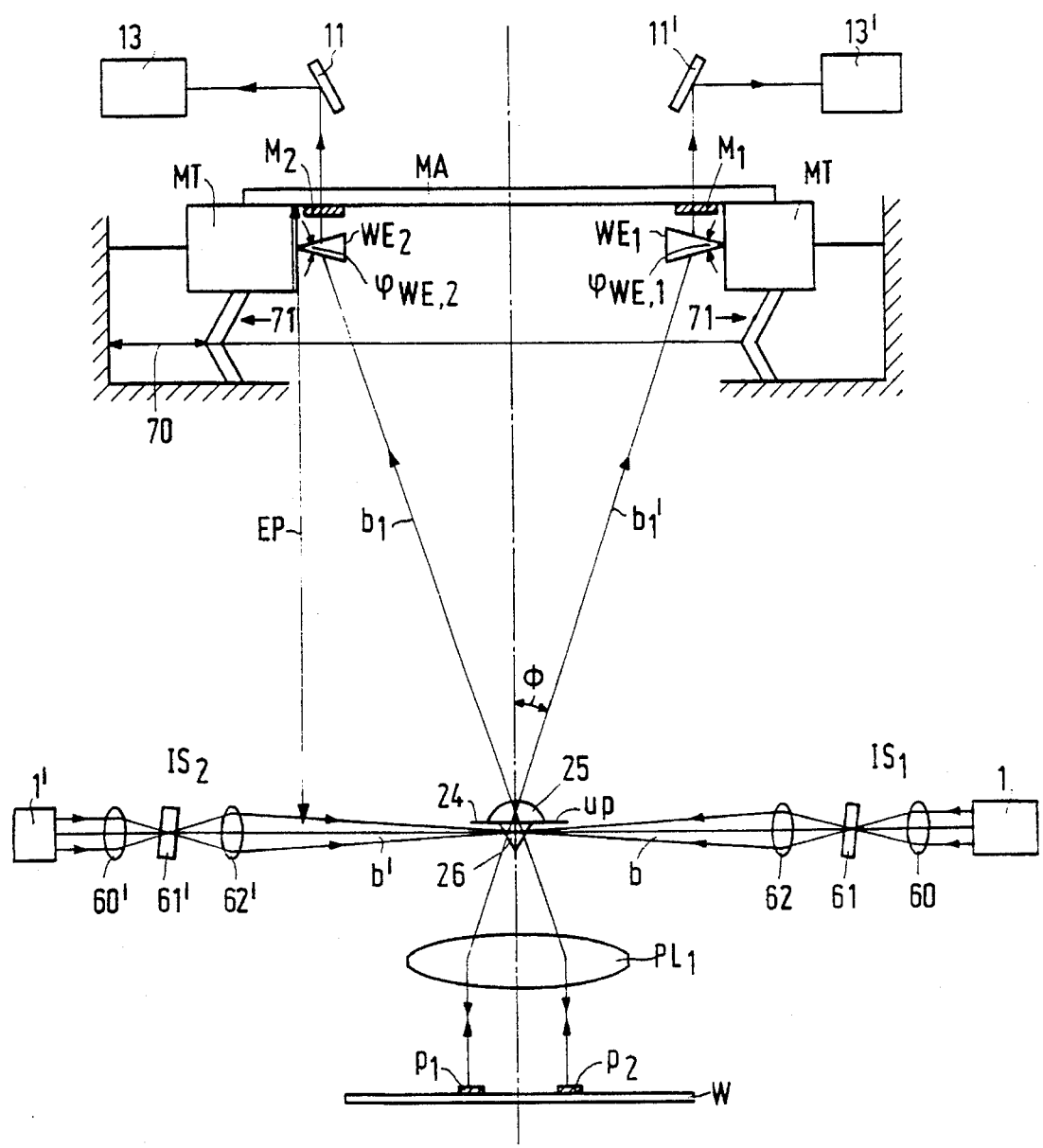
FIG. 9 shows an embodiment of such a device.

FIG. 9 shows an embodiment of a double alignment device in which the invention is used. Wedge-shaped elements $WE_1$ and $WE_2$ are arranged under the mask alignment marks $M_1$ and $M_2$, which elements deflect the chief rays of the alignment beams $b_1'$ and $b_1$ from the substrate alignment marks $P_1$ and $P_2$ in such a way that these chief rays are perpendicular to the mask plate MA. The alignment beams traverse the marks $M_1$ and $M_2$ in known manner and are subsequently directed towards the detection systems 13' and 13 by the reflectors 11' and 11. The mask and the substrate can be aligned with respect to each other by means of the output signals of these systems, for example, by displacing the mask table MT, as is symbolically indicated by means of the double-headed arrow 70 and the parallelogram construction 71 described in U.S. Pat. No. 4,698,575.

In the embodiment of FIG. 9 the alignment beams b and b' coming from two separate illumination systems $IS_1$ and $IS_2$ each comprising a radiation source 1 (1'), two lenses 60, 62 (60', 62') and an adjustable plane-parallel plate 61 (61') with which a precision adjustment of the direction of the beam b (b') can be realised. The lenses 60 and 62 ensure that the quality of the image of the source 1 (1') is maintained. The beams b and b' are reflected towards the substrate alignment marks $P_1$ and $P_2$ by a reflecting prism 26 which is present within the projection lens system. For the sake of simplicity only the lens group under the Fourier plane is diagrammatically illustrated by means of one lens element $PL_1$ in this projection lens system.

As will be described hereinafter, the beam coupling prism 26 is preferably present at the height of the Fourier plane of the projection lens system. The angle Φ which must be corrected by the wedge is defined by:

$$\tan\Phi = \frac{M_1 - M_2}{2 \times EP}$$

in which $M_1-M_2$ is the distance between the mask marks $M_1$ and $M_2$ and EP is the distance between the mask plate MA and the exit pupil UP of the projection lens system at the side of the mask. In one embodiment of the projection apparatus in which the distance between the marks $M_1$ and $M_2$ is 96 mm and the distance EP is 400 ram, the angle Φ to be corrected is 120 mrad. This requires a wedge having a wedge angle $\phi_{WE}$ of only 240 mrad. Such a wedge may consist of a small piece of glass having a thickness of only 2 mm. It is not necessary to impose strict requirements of mechanical and thermal stability on such a wedge.

In the axial direction the wedge must be positioned in a stable manner with respect to the mask plate with an accuracy of $$\frac{M \times \Delta a}{\phi} \quad \frac{nm}{mrad}.$$

Here M is the magnification of the projection lens system and $\Delta a$ is the still admissible alignment error at the area of the substrate. In one embodiment with M=5, $\Delta a$=5 nm and $\phi$=120 mrad the value of $$\frac{M \times \Delta a}{\phi} = 120 \text{ nm}.$$

It has been found that with such a wedge the measurement of the magnification error and the inspection which, as described in U.S. Pat. No. 4,778,275 can be carried out with the aid of the substrate marks $P_1$ and $P_2$ and the mask marks $M_1$ and $M_2$, still function satisfactorily, provided that the distance between the mask marks $M_1$ and $M_2$ is considerably shorter than the distance EP in FIG. 9.

Instead of a wedge, a different element such as, for example, a mirror or a lens may be used to correct the directions of the selected order sub-beams.

In the projection apparatus according to the invention a correction lens or another refractive correction element is preferably arranged in the projection lens system, as has already been illustrated in FIGS. 1, 3 and 9, so as to correct for the difference between the wavelengths of the projection beam and the alignment beam.

Since the projection lens system PL is designed for the wavelength of the projection beam PB, which must be as small as possible in view of the desired large resolving power, deviations occur when using this system PL for imaging the alignment marks $P_1$, $P_2$ and $M_1$, $M_2$ on each other by means of the alignment beam. For example, the substrate alignment marks $P_1$, $P_2$ will not be imaged in the plane of the mask pattern in which the mask alignment marks are located, but will be imaged at a given distance therefrom, which distance depends on the difference between the wavelengths of the projection beam and the alignment beam and on the difference between the refractive indices of the material of the projection lens elements for the two wavelengths. If the projection beam has a wavelength of, for example, 248 nm and the alignment beam has a wavelength of 633 nm, this distance may be as large as 2 m.

Moreover, due to the wavelength difference a substrate alignment mark is imaged on a mask alignment mark with a magnification which deviates from the desired magnification, while the deviation increases with an increasing wavelength difference.

To correct for the deviations, the projection column PL incorporates an extra lens, or correction lens 25. The correction lens is arranged at such a height in the projection column that the sub-beams of the different diffraction orders of the alignment beam, which sub-beams are formed by a substrate alignment mark, are sufficiently separated in the plane of the correction lens so as to be able to influence these sub-beams separately, while this correction lens has a negligible influence on the projection beam and the mask image formed therewith. The correction lens is preferably situated in the Fourier plane of the projection lens system. If, as is shown in FIGS. 3 and 9, the correction lens 25 is situated in a plane 24 in which tile chief rays of the alignment beams $b_1$ and $b_1'$ intersect one another, this lens may be used for correcting the two alignment beams simultaneously.

Figure 10:
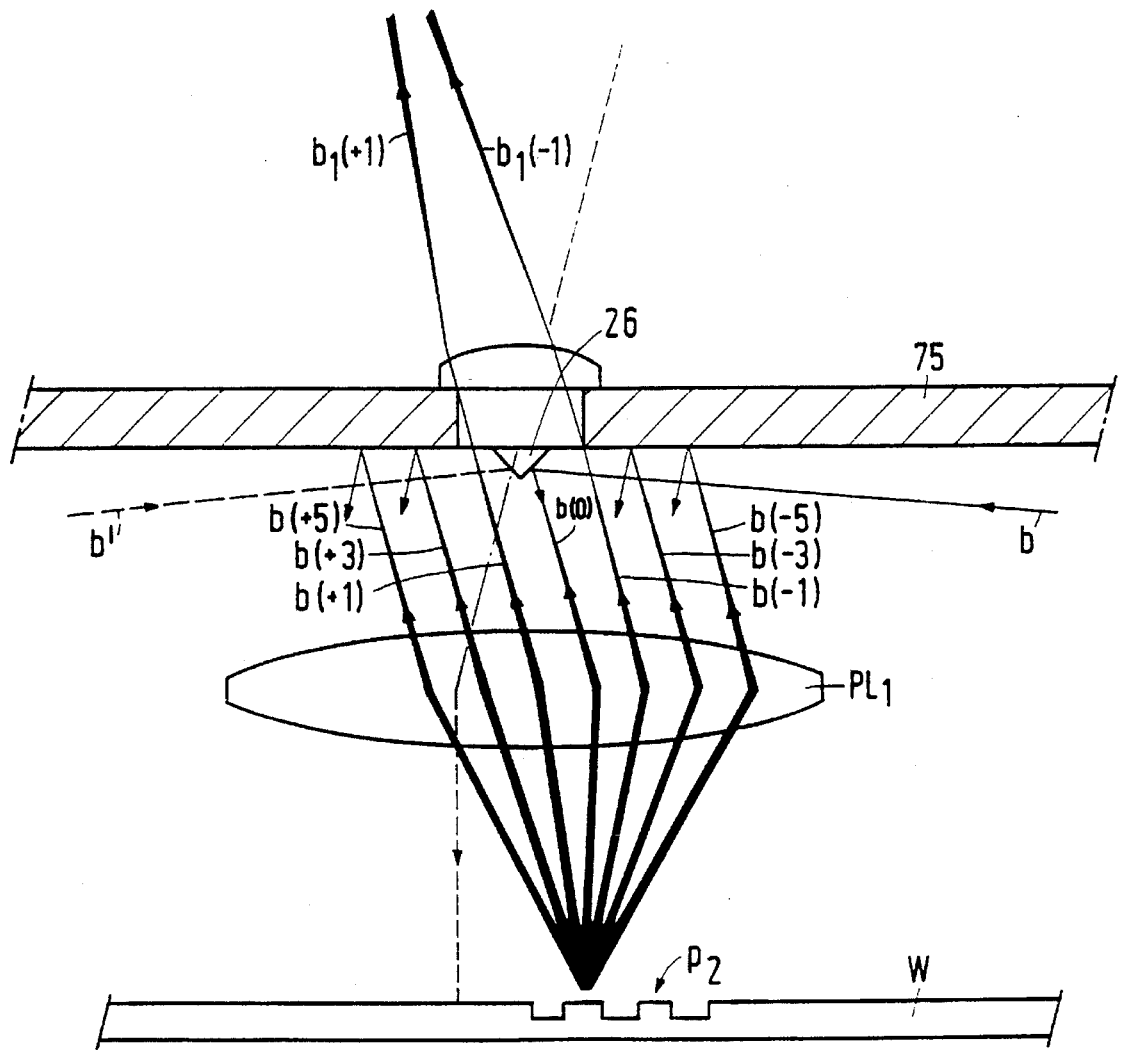
FIG. 10 shows the operation of a correction lens which can be used in this device.

The effect of the correction lens 25 can be explained with reference to FIG. 10 which shows the part of the radiation path of the alignment beams between the correction lens and the substrate alignment mark $P_2$. This mark is in the form of a diffraction grating. The alignment beam b incident on the grating $P_2$ is split into a zero-order sub-beam b(0) which has the same direction as the beam b in the case of perpendicular incidence of the beam b, two sub-beams b(+1), b(−1) of the first order and a number of pairs of sub-beams of the third, fifth, etc. orders. These sub-beams are reflected to the projection lens system. The first-order sub-beams reach the correction lens 25 located in the plane 24. This lens has such a power that it changes the directions of the first-order sub-beams b(−1) and b(+1) in such a way that the chief rays of these beams intersect one another in the plane of the mask alignment mark $M_2$. Moreover, the correction lens has such a small diameter that the higher order sub-beams which are deflected by the mark $P_2$ through larger angles than the first-order sub-beams do not pass through this lens. Furthermore, an element is arranged at the correction lens, which element prevents the zero-order sub-beam b(0) from passing through the correction lens. In the embodiment of FIG. 10 this element is constituted by the reflecting prism 26 which is used to couple the alignment beams b and b' into the projection lens system. This prism reflects the zero-order sub-beam b(0) towards the incident alignment beam b. It is achieved by these measures that only the first-order sub-beams are used for imaging the grating $P_2$ on the grating $M_2$ so that some additional advantages are obtained.

The zero-order sub-beam does not comprise information about the position of the grating $P_2$. The intensity of this sub-beam may be considerable as compared with the intensity of the first-order sub-beams, dependent on the geometry of the grating, notably the depth of the grating grooves and the ratio between the width of these grooves and the width of the intermediate grating strips. By suppressing the zero-order sub-beam, the contrast in the image of $P_2$ can be increased considerably. Since the third and higher order sub-beams are suppressed, irregularities in the grating $P_2$ do not have any influence on the alignment signal. When using the first-order sub-beams only, the second harmonic of the grating $P_2$ is imaged, as it were, i.e. apart from the magnification M of the projection lens system PL, the image of $P_2$ has a period which is half that of the grating $P_2$. If it is ensured that the grating period of the grating $M_2$ is equal to that of the image of $P_2$, i.e. equal to m/2 times the grating period of the grating $P_2$, the accuracy with which the gratings $M_2$ and $P_2$ are aligned is twice as large as in the case where the complete beam b is used for the imaging.

Under certain circumstances, particularly with a smaller difference between the wavelengths of the projection beam PB and an alignment beam b, b' and when using achromatic lens elements in the projection lens system, it may occur that the sub-beams having diffraction orders which are higher than one still reach the mask alignment mark $M_2$ via the projection lens system. In this case a diaphragm plate 75 may be arranged in the plane of, or proximate to the correction lens 25 which passes the first-order sub-beams only. The material of the plate may be dichroic and transparent to the projection beam, but opaque to the alignment beam. Alternatively, the material of the plate 75 may be transparent to both the projection beam and to the alignment beam. Then regions blocking the radiation of the alignment beam are located at those positions where portions of the alignment beam having diffraction orders which are higher than one reach the plate. These regions are small and they jointly cover only 5 to 10% of the surface area of the pupil of the projection lens system so that they have a negligible influence on the projection beam.

The correction lens 25 does not only ensure that an alignment beam is sharply focused on the mask plane, but it can also correct for the magnification error with which a substrate alignment mark is imaged on a mask alignment mark. Such magnification error is a result of the fact that the projection lens system is designed for the wavelength of the projection beam and not for that of an alignment beam. This magnification error correction will be sufficient in many cases. In an apparatus in which a deep-ultraviolet beam having a wavelength of, for example, 248 nm is used as a projection beam, it may occur that the correction lens 25 cannot completely correct (he magnification error. In this case an extra lens 9 (FIG. 3) may be arranged in the path of the alignment beam between the projection lens system PL and the mask alignment mark so as to eliminate the residual magnification error.

The alignment of the alignment marks $P_2$ and $M_2$ in the X direction with the aid of the first-order sub-beams diffracted in the Y-Z plane has been described hereinbefore. When two-dimensional diffraction gratings are used, as is shown in FIG. 2, sub-beams having the same diffraction orders as in the X-Z plane are also produced in the Y-Z plane. The first-order sub-beams of the first-mentioned sub-beams can be filtered out and used for alignment in the Y direction. The same deflection prisms $WE_1$ and $WE_2$ and the same correction lens as for the X alignment can then be used.

The invention may not only be used in an apparatus having a double alignment device and a refractive correction element 25, but also in a double alignment device without this element, such as the device described in U.S. Pat. No. 4,778,275. The invention may be further used in a single alignment device including a correction element 25 or without this element, such as the device described in U.S. Pat. No. 4,251,160.

Figure 11:
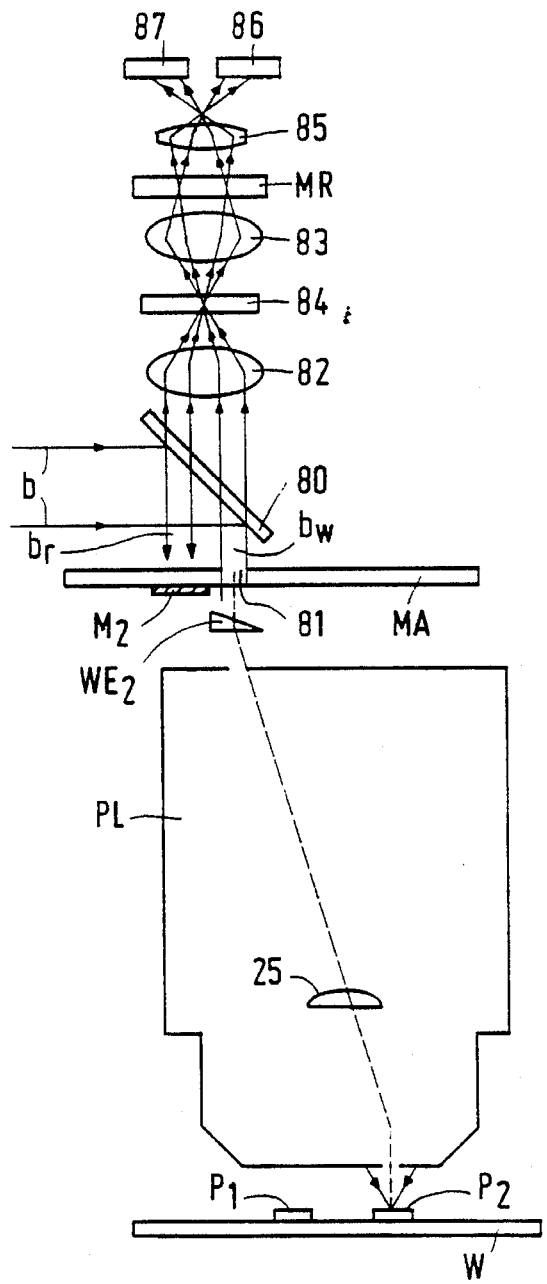
FIGS. 11, 12, 12A, 12B and 13 show second, third and fourth embodiments of an alignment device according to the invention.

Moreover, the invention may be used in a projection apparatus in which a mask alignment mark and a substrate mark are not directly aligned on each other but through a reference alignment mark. FIG. 11 shows diagrammatically an embodiment of such an apparatus. In this apparatus an alignment beam b illuminates the mask alignment mark $M_2$ and a juxtaposed window 81 in the mask MA via a partly reflecting dement 80, for example, a partly transparent mirror. The mask alignment mark $M_2$ reflects alignment radiation toward the reference alignment mark $M_R$. This radiation images the mark $M_2$ on the mark $M_R$, while only the sub-beams which are diffracted in the first orders by the mark $M_2$ participate in the projection. To this end, a Fourier lens system may be used, which system comprises a first Fourier transform lens 82 in the focal plane of which a filter plate 84 is arranged, and a second Fourier transform lens 83 whose focal plane coincides with the plane of the falter plate 84. The first lens 82 focuses the beam portion $b_r$ on the filter plate which passes only the first-order sub-beams. The second lens 83 forms an image of the mark $M_2$ on a first portion of the reference alignment mark $M_R$. This portion and the superposed image of $M_2$ are imaged by a lens 85 on a first detector 86.

The alignment beam portion $b_w$ passing through the window 81 illuminates the substrate alignment mark $P_2$ via the projection lens system PL. This system, which may include a correction dement 25, images the mark $P_2$ in the plane of the mark $M_2$, while only the first-order sub-beams are used. The beam portion $b_w$ then passes through the lens 82, the filter plate 84 and the lens 83 in an analogous way as the reflected beam portion $b_r$, so that the mark $P_2$ is imaged on a second portion of the reference mark $M_R$. This portion and the superposed image of $P_2$ are imaged by the lens 85 on a second detector 87. By comparing, for example, the phases of the output signals of the detectors, the extent of mutual alignment of the marks $M_2$ and $P_2$ can be determined in a manner analogous to that described in U.S. Pat. No. 3,811,779.

According to the invention a wedge $WE_2$, or another beam deflecting dement, is arranged in the radiation path of the beam $b_w$ reflected by the substrate and proximate to the mask plate MA, which wedge ensures that the axis of symmetry of this beam is perpendicular to the mask plate. Although there is no alignment mark in the mask plate at the location of the beam $b_w$, so that no three-fold order sub-beams are formed, extra sub-beams may be produced due to extra reflections on the plate surfaces, which sub-beams may exhibit mutual phase differences when they are not perpendicularly incident on the axis of symmetry so that an erroneous alignment signal would be obtained. Since it has been ensured that the axis of symmetry of the beam $b_w$ is perpendicular to the mask plate, this effect is avoided.

Figures 12, 12A, 12B:
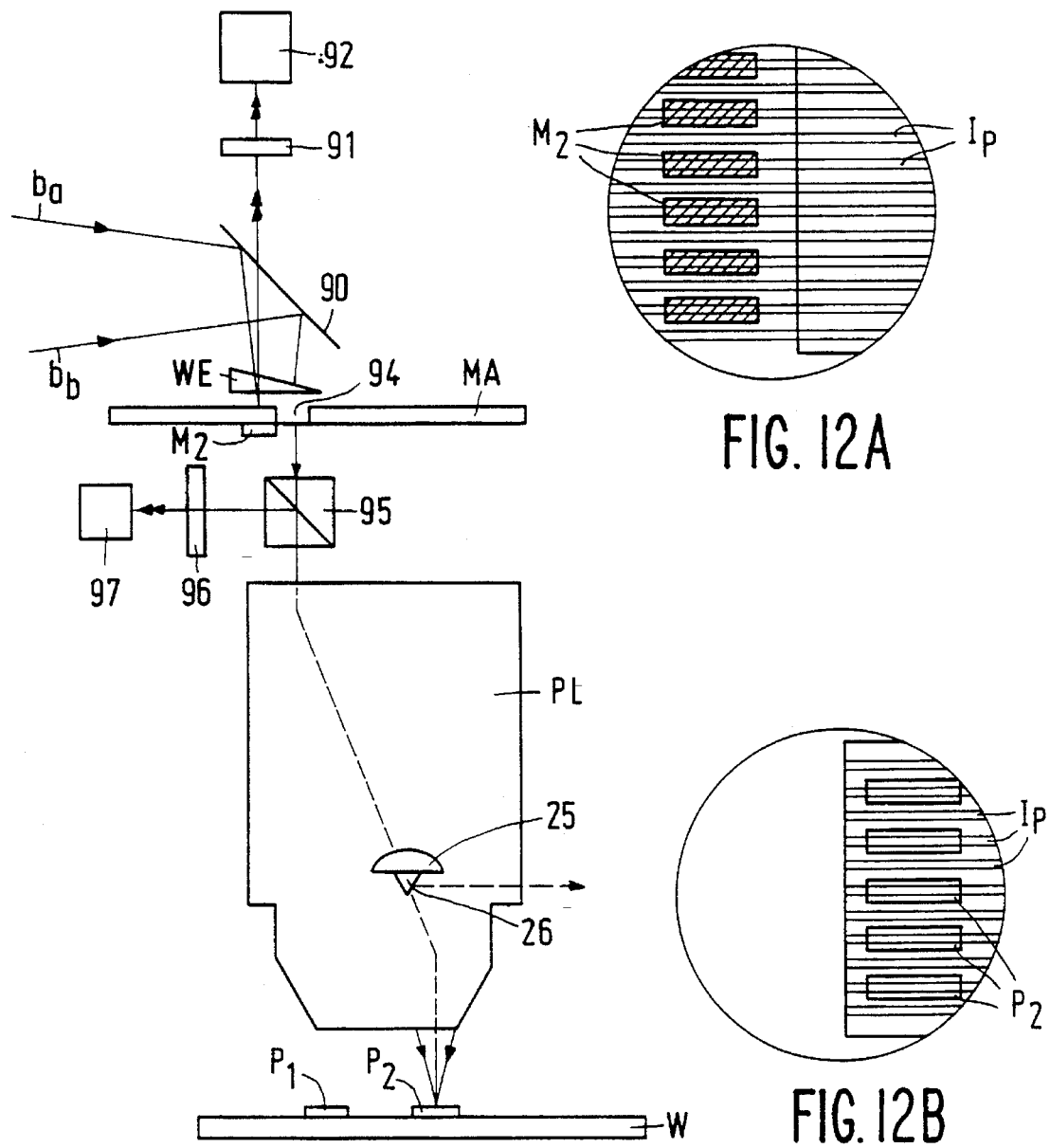

FIG. 12 shows diagrammatically another possibility of indirectly aligning a mask alignment mark and a substrate alignment mark with respect to each other, in which method an artificial alignment mark instead of a physical alignment mark is used as the third mark. This third mark consists of an interference pattern IP formed by two beams $b_a$ and $b_b$, which interfere with each other in the plane of the mask alignment mark $M_2$. The principle of using an interference pattern for aligning a substrate alignment mark and a mask alignment mark with respect to each other is described in the article "Heterodyne Holographic Nanometer Alignment for a Waferstepper" in "Microcircuit Engineer" Program and Abstracts Cambridge (GB), 28 Sep. 1989.

FIG. 12A shows the interference pattern IP which is superposed on the mask alignment mark $M_2$ implemented as a reflective grating. This grating deflects the incident radiation in different diffraction orders towards a first detector 92. A filter 91 passing only the first-order sub-beams is arranged in front of this detector. The output signal of the detector 92 represents the position of the mark $M_2$ with respect to the interference pattern IP.

Next to the mark $M_2$ the mask MA has a window 94 passing radiation from the interfering beams $b_a$ and $b_b$ to the projection lens system PL. This system re-images the interference pattern IP on the substrate alignment mark $P_2$, as is shown in FIG. 12B. The mark $P_2$ implemented as a reflective grating deflects the incident radiation in a plurality of reflected diffraction orders. The reflected radiation reaches a second detector 97 via the projection lens system and a partially transparent prism 95. According to the present invention a wedge-shaped or other radiation deflection element is arranged in the radiation path of the interfering beams $b_a$ and $b_b$, which wedge ensures that the axis of symmetry of the radiation is perpendicular to the mask plate. A filter 96 for selecting the first-order sub-beams may be arranged between the detector 97 and the prism 95.

Analogously as is shown in FIGS. 1 and 9, it is alternatively possible to arrange a reflector 26 below the correction element 25, which reflector reflects the first-order sub-beams to the right so that these beams can leave the projection lens via a window in the wall of the projection lens holder, as is denoted by the broken-line ray.

The beams $b_a$ and $b_b$ may be modulated beams, with the modulation frequency for the two beams being different. The interference pattern which is then formed varies with time so that it is simulated that the interference pattern moves across the mask alignment mark and across the substrate alignment mark, which results in periodically varying alignment signals. The difference between the phases of the output signals of the detectors 92 and 97 is then representative of the extent to which the marks $M_2$ and $P_2$ are mutually aligned.

Figure 13:
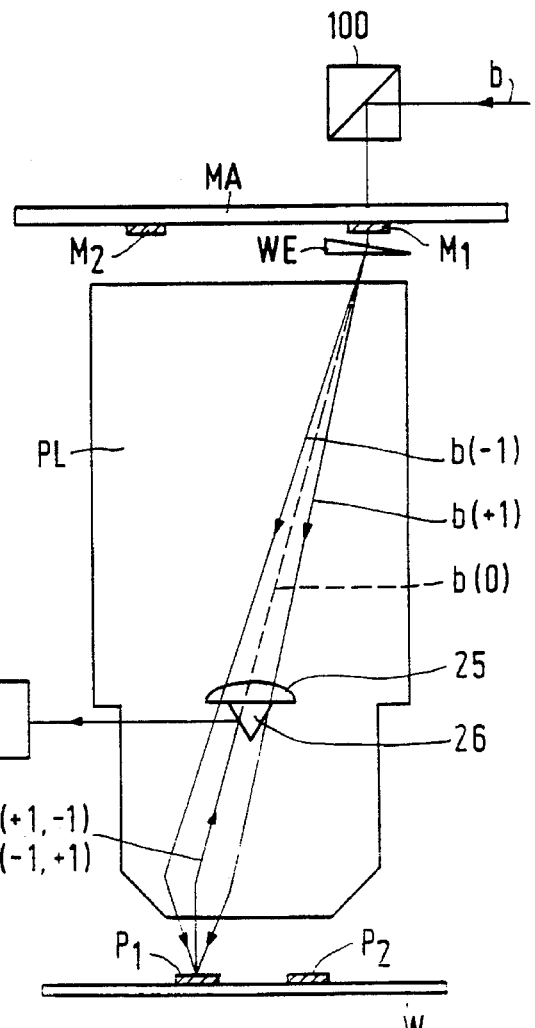

FIG. 13 shows an embodiment of the alignment device in which a mask alignment mark, $M_1$ or $M_2$, or a substrate alignment mark, $P_1$ or $P_2$, is imaged by the projection lens system and with the aid of the first-order sub-beams b(+1) and b(−1) which are formed by the mask alignment mark from the entering beam b. As in the other embodiments, these sub-beams traverse the projection lens obliquely. In order to cause the beam b to be incident perpendicularly to the mask plate MA via the prism 100 under this condition, so that extra reflections on this plate do not have any influence on the alignment signal obtained, a wedge-shaped or other deflection element WE according to the invention is arranged below the mask plate. The portions of the sub-beams b(+1) and b(−1) which are reflected by the substrate alignment mark $P_1$ and diffracted in the −1 order and the +1 order, respectively, i.e. the two-fold order sub-beams b(+1, −1) and b(−1,+1) have the same direction which is opposite to the direction of the zero-order sub-beam b(0) from the mark $M_1$, which beam is not passed. The sub-beams b(+1, −1) and b(−1,+1), which comprise information about the mutual position of the marks $M_1$ and $P_1$, are reflected to the detection system 101 by the reflector 26.

The alignment devices according to FIGS. 11, 12 and 13 may alternatively be doubled.

Generally, a double alignment system is preferred because the relative angle orientation of the mask pattern and the substrate is directly laid down optically, while magnification errors of the projection lens system as well as deformations in the substrate and the mask can be measured.

The accuracy with which the substrate alignment marks can be aligned with respect to the mask alignment marks is considerably enhanced by modulating the output signals of the detectors, for example, 13 and 13' in FIGS. 1, 3 and 9, with a fixed frequency. To this end the mask M and hence, for example, the mask mark $M_2$ can be periodically moved, as has been described in the article in "SPIE", Vol. 470 "Optical Microlithography" III "Technology for the next Decade" 1984, pp. 62–69. A better alternative for obtaining a dynamic alignment signal, described in U.S. Pat. No. 4,251,160, with which the accuracy of the alignment device according to the invention can also be enhanced is shown in FIG. 3.

Before reaching the mark $M_2$, the beam $b_1$ has traversed the polarization-sensitive splitting prism 2 so that this beam is linearly polarized and has a given direction of polarization. Subsequently, the beam $b_1$ traverses a plate 8 of birefringent material, for example, quartz whose optical axis extends at an angle of 45° to the direction of polarization of the beam leaving the prism 2. The element 8 may also be a Savart plate or a Wollaston prism. Two mutually perpendicularly polarized beams leave the plate 8, which beams are shifted with respect to each other at the location of the mask mark $M_2$ over a given distance which is determined by the geometry of the mark $M_2$. When using gratings as alignment marks, the distance is equal to half the grating period of the grating $M_2$. A polarization modulator 18 and a polarization analyser 19 are arranged in front of the detector 13. The modulator 18, for example, an elasto-optical modulator is controlled by a voltage $V_B$ which is supplied by a generator 20. The direction of polarization of the beam passing through the modulator is thereby switched alternately through 90°. The analyser 19 has the same main direction, or pass direction, as the polarization-sensitive splitting prism 2 so that alternately a first radiation beam having a first direction of polarization, which beam has formed, for example, a non-shifted image of $P_2$ on $M_2$, and a second radiation beam having a second direction of polarization, which beam has formed, for example, an image of $P_2$ on $M_2$ shifted over half a grating period, are passed to the detector 13. The signal of the detector 13 is amplified and processed in a phase-sensitive detection circuit 21 to which also the signal $V_B$ is applied. The output signal $S_A$ is the desired dynamic alignment signal.

The modulator 18 and analyser 19 may alternatively be arranged in the radiation path in front of the mask alignment mark.

The fact that the alignment marks are diffraction gratings in the embodiments described does not mean that the invention is limited thereto. Also when aligning with marks in the form of radiation-transparent or reflecting strips, crosses or squares, a deflection element according to the invention may be used to image these marks in the correct position and with the desired magnification so that no interference signals or offsets are produced.

Apart from alignment devices in which two sub-beams having the same diffraction order number, for example, +1 and −1, or +and −3 are used, the invention may also be used in alignment devices which do not employ sub-beams having a given diffraction order but beam portions in which diffraction orders can no longer be distinguished. An example is an alignment device in which a so-called dark field illumination is used. Such a device is described in the article "Optical Step and Repeat Camera with Dark Field Automatic Alignment" in Journal of Vac. Sci. Technologies, November/December 1979, pp. 1929–33 and in the article "Dark Field Technology: a Practical Approach to Local Alignment" in "SPIE", Vol. 772, Optical Microlithography VI, 1987, pp. 142–9. A wedge-shaped or other deflection element can also be arranged proximate to a mask alignment mark in these devices.

Since the described alignment device operates independently of the kind of pattern C which is present in the mask M, the invention may be used whenever a very fine, detailed pattern must be transferred onto a substrate and when this pattern must be aligned very accurately with respect to the substrate. Examples are apparatuses which are used for the manufacture of integrated optical systems or of magnetic domain memories. The apparatus with which a pattern is projected need not be a repetitive projection apparatus. The invention may also be useful in an apparatus in which a pattern is projected on a substrate only once.

We claim:

1. An apparatus for projecting a mask pattern onto a substrate comprising:
   (a) illumination means for supplying a projection radiation beam,
   (b) at least one mask holder and at least one substrate holder,
   (c) first means for aligning a mask on said mask holder with respect to a substrate on said substrate holder, said first means including
      (i) radiation source means for supplying an alignment beam,
      (ii) projection lens means for projecting said radiation beam, and
      (iii) radiation-sensitive detection means for measuring mutual positions of first alignment marks with second alignment marks on which said first alignment marks are imaged, said detection means being disposed in a path of selected alignment beam portions, said selected alignment beam portions interacting with said first alignment marks and said respective second alignment marks,
   (d) second means for preventing phase differences due to reflections at said mask from occurring within said selected alignment beam portions received by said radiation-sensitive detection means, said second means being arranged in said path of said selected alignment beam portions,
   wherein said second means includes radiation deflection means in the vicinity of a mask alignment mark for directing an axis of symmetry of said selected alignment beam portions substantially perpendicularly to a plane of said mask, said radiation deflection means being considerably smaller than a cross-section of said projection beam in said plane of said mask, and
   wherein said radiation deflection means is a wedge-shaped body of a material transparent to said selected alignment beam portions.

2. An apparatus according to claim 1, wherein said first means aligns a first mask alignment mark with respect to a first substrate alignment mark, wherein a third means is included for aligning a second mask alignment mark with respect to a second substrate alignment mark, and wherein another radiation deflection means is disposed in a path of a second alignment beam in the vicinity of said second mask alignment mark.

3. An apparatus according to claim 1, wherein said first alignment marks include a substrate alignment mark and said mask alignment mark includes one of said second alignment marks, and wherein said radiation deflection means is disposed in a path of said alignment beam coming from said substrate alignment mark.

4. An apparatus according to claim 1, wherein said first alignment marks include a mask alignment mark and said second alignment marks include a substrate alignment mark, and wherein said radiation deflection means is disposed in a path of said alignment beam coming from said mask alignment mark.

5. An apparatus according to claim 1, wherein said second alignment marks include a reference alignment mark, said reference alignment mark being disposed both outside said substrate and said mask, and wherein both a substrate alignment mark and said mask alignment mark constitute said first alignment marks, said substrate alignment mark and said mask alignment mark each being imaged on said reference alignment mark.

6. An apparatus according to claim 1, wherein said radiation source means supplies two radiation beams forming an interference pattern in the plane of a substrate alignment mark and in the plane of said mask alignment mark, wherein both said substrate alignment mark and said mask alignment mark are said second alignment marks, and wherein said first alignment marks are constituted by said interference pattern.

7. An apparatus according to claim 1, wherein one of said alignment marks include a mask alignment mark, wherein said mask alignment mark is constituted by an amplitude diffraction grating and a substrate alignment mark is constituted by a phase diffraction grating.

8. An apparatus according to claim 1, further comprising third means controlled by periodical signals for periodically displacing a second alignment mark and an image on said second alignment mark of a first alignment mark with respect to each other, wherein said third means are disposed in a radiation path of said alignment beam, and wherein said image of said first alignment mark is observed by said radiation-sensitive detection means.

9. An apparatus for projecting a mask pattern onto a substrate comprising:
   (a) illumination means for supplying a projection radiation beam,
   (b) at least one mask holder and at least one substrate holder,
   (c) first means for aligning a mask on said mask holder with respect to a substrate on said substrate holder, said first means including
      (i) radiation source means for supplying an alignment beam,
      (ii) projection lens means for projecting said radiation beam, and
      (iii) radiation-sensitive detection means for measuring mutual positions of first alignment marks with second alignment marks on which said first alignment marks are imaged, said detection means being disposed in a path of selected alignment beam portions, said selected alignment beam portions interacting with said first alignment marks and said respective second alignment marks,
   (d) second means for preventing phase differences due to reflections at said mask from occurring within said selected alignment beam portions received by said radiation-sensitive detection means, said second means being arranged in said path of said selected alignment beam portions, and
   (e) refractive correction means disposed in a path of said alignment beam and disposed in said projection lens means for only directing and focusing said selected alignment beam portions from said first alignment marks onto said second alignment marks, said refractive correction means being considerably smaller than a cross-section of said projection lens means in a plane of said refractive correction means,
   wherein said refractive correction means is a lens.

10. An apparatus according to claim 9, wherein said second alignment marks include a reference alignment mark, said reference alignment mark being disposed both outside said substrate and said mask, and wherein both a substrate alignment mark and said mask alignment mark constitute said first alignment marks, said substrate alignment mark and said mask alignment mark each being imaged on said reference alignment mark.

11. An apparatus according to claim 9, wherein said radiation source means supplies two radiation beams forming an interference pattern in the plane of a substrate alignment mark and in the plane of said mask alignment mark, wherein both said substrate alignment mark and said mask alignment mark are said second alignment marks, and wherein said first alignment marks are constituted by said interference pattern.

12. An apparatus according to claim 9, wherein said mask alignment mark is constituted by an amplitude diffraction grating and a substrate alignment mark is constituted by a phase diffraction grating.

13. An apparatus according to claim 9, further comprising third means controlled by periodical signals for periodically displacing a second alignment mark and an image on said second alignment mark of a first alignment mark with respect to each other, wherein said third means are disposed in a radiation path of said alignment beam, and wherein said image of said first alignment mark is observed by said radiation-sensitive detection means.

14. An apparatus for projecting a mask pattern onto a substrate comprising:
   (a) illumination means for supplying a projection radiation beam,
   (b) at least one mask holder and at least one substrate holder,
   (c) first means for aligning a mask on said mask holder with respect to a substrate on said substrate holder, said first means including
      (i) radiation source means for supplying an alignment beam,
      (ii) projection lens means for projecting said radiation beam, and
      (iii) radiation-sensitive detection means for measuring mutual positions of first alignment marks with second alignment marks on which said first alignment marks are imaged, said detection means being disposed in a path of selected alignment beam portions, said selected alignment beam portions interacting with said first alignment marks and said respective second alignment marks,
   (d) second means for preventing phase differences due to reflections at said mask from occurring within said selected alignment beam portions received by said radiation-sensitive detection means, said second means being arranged in said path of said selected alignment beam portions, and
   (e) refractive correction means disposed in a path of said alignment beam and disposed in said projection lens means for only directing and focusing said selected alignment beam portions from said first alignment marks onto said second alignment marks, said refractive correction means being considerably smaller than a cross-section of said projection lens means in a plane of said refractive correction means,
   wherein said refractive correction means is disposed in the Fourier plane of said projection lens means.

15. An apparatus according to claim 14, wherein said second alignment marks include a reference alignment mark, said reference alignment mark being disposed both outside said substrate and said mask, and wherein both a substrate alignment mark and said mask alignment mark constitute said first alignment marks, said substrate alignment mark and said mask alignment mark each being imaged on said reference alignment mark.

16. An apparatus according to claim 14, wherein said radiation source means supplies two radiation beams forming an interference pattern in the plane of a substrate alignment mark and in the plane of said mask alignment mark, wherein both said substrate alignment mark and said mask alignment mark are said second alignment marks, and wherein said first alignment marks are constituted by said interference pattern.

17. An apparatus according to claim 14, wherein said mask alignment mark is constituted by an amplitude diffraction grating and a substrate alignment mark is constituted by a phase diffraction grating.

18. An apparatus according to claim 14, further comprising third means controlled by periodical signals for periodically displacing a second alignment mark and an image on said second alignment mark of a first alignment mark with respect to each other, wherein said third means are disposed in a radiation path of said alignment beam, and wherein said image of said first alignment mark is observed by said radiation-sensitive detection means.

19. An apparatus for projecting a mask pattern onto a substrate comprising:
    (a) illumination means for supplying a projection radiation beam,
    (b) at least one mask holder and at least one substrate holder,
    (c) first means for aligning a mask on said mask holder with respect to a substrate on said substrate holder, said first means including
        (i) radiation source means for supplying an alignment beam,
        (ii) projection lens means for projecting said radiation beam, and
        (iii) radiation-sensitive detection means for measuring mutual positions of first alignment marks with second alignment marks on which said first alignment marks are imaged, said detection means being disposed in a path of selected alignment beams portions, said selected alignment beam portions interacting with said first alignment marks and said second alignment marks,
    (d) second means for preventing phase differences due to reflections at said mask from occurring within said selected alignment beam portions received by said radiation-sensitive detection means, said second means being arranged in said path of said selected alignment beam portions, wherein one of said alignment marks include a mask alignment mark, and a part of said mask on a surface of said mask opposite said mask alignment mark is anti-reflective to said alignment beam, and
    (e) refractive correction means disposed in a path of said alignment beam and disposed in said projection lens means for only directing and focusing said selected alignment beam portions from said first alignment marks onto said second alignment marks, said refractive correction means being considerably smaller than a cross-section of said projection lens means in a plane of said refractive correction means,
    wherein said refractive correction means is a lens.

20. An apparatus according to claim 19, wherein said second alignment marks include a reference alignment mark, said reference alignment mark being disposed both outside said substrate and said mask, and wherein both a substrate alignment mark and said mask alignment mark constitute said first alignment marks, said substrate alignment mark and said mask alignment mark each being imaged on said reference alignment mark.

21. An apparatus according to claim 20, wherein said mask alignment mark is constituted by an amplitude diffraction grating and a substrate alignment mark is constituted by a phase diffraction grating.

22. An apparatus according to claim 19, wherein said radiation source means supplies two radiation beams forming an interference pattern in the plane of a substrate alignment mark and in the plane of a mask alignment mark, wherein both said substrate alignment mark and said mask alignment mark are said second alignment marks, and wherein said first alignment marks are constituted by said interference pattern.

23. An apparatus according to claim 19, wherein a mask alignment mark is constituted by an amplitude diffraction grating and a substrate alignment mark is constituted by a phase diffraction grating.

24. An apparatus according to claim 19, further comprising third means controlled by periodical signals for periodically displacing a second alignment mark and an image on said second alignment mark of a first alignment mark with respect to each other, wherein said third means are disposed in a radiation path of said alignment beam, and wherein said image of said first alignment mark is observed by said radiation-sensitive detection means.

25. An apparatus for projecting a mask pattern onto a substrate comprising:
    (a) illumination means for supplying a projection radiation beam,
    (b) at least one mask holder and at least one substrate holder,
    (c) first means for aligning a mask on said mask holder with respect to a substrate on said substrate holder, said first means including
        (i) radiation source means for supplying an alignment beam,
        (ii) projection lens means for projecting said radiation beam, and
        (iii) radiation-sensitive detection means for measuring mutual positions of first alignment marks with second alignment marks on which said first alignment marks are imaged, said detection means being disposed in a path of selected alignment beams portions, said selected alignment beam portions interacting with said first alignment marks and said second alignment marks,
    (d) second means for preventing phase differences due to reflections at said mask from occurring within said selected alignment beam portions received by said radiation-sensitive detection means, said second means being arranged in said path of said selected alignment beam portions,
    wherein one of said alignment marks include a mask alignment mark, and a part of said mask on a surface of said mask opposite said mask alignment mark is anti-reflective to said alignment beam, and
    (e) refractive correction means disposed in a path of said alignment beam and disposed in said projection lens means for only directing and focusing said selected alignment beam portions from said first alignment marks onto said second alignment marks, said refractive correction means being considerably smaller than a cross-section of said projection lens means in a plane of said refractive correction means,
    wherein said refractive correction means is disposed in the Fourier plane of said projection lens means.

26. An apparatus according to claim 24, wherein said second alignment marks include a reference alignment mark, said reference alignment mark being disposed both outside said substrate and said mask, and wherein both a substrate alignment mark and said mask alignment mark constitute said first alignment marks, said substrate alignment mark and said mask alignment mark each being imaged on said reference alignment mark.

27. An apparatus according to claim 24, wherein said radiation source means supplies two radiation beams forming an interference pattern in the plane of a substrate alignment mark and in the plane of said mask alignment mark, wherein both said substrate alignment mark and said mask alignment mark are said second alignment marks, and wherein said first alignment marks are constituted by said interference pattern.

28. An apparatus according to claim 25, further comprising third means controlled by periodical signals for periodically displacing a second alignment mark and an image on said second alignment mark of a first alignment mark with respect to each other, wherein said third means are disposed in a radiation path of said alignment beam, and wherein said image of said first alignment mark is observed by said radiation-sensitive detection means.

* * * * *